United States Patent
Simpson et al.

(10) Patent No.: US 6,232,636 B1
(45) Date of Patent: May 15, 2001

(54) LATERAL THIN-FILM SILICON-ON-INSULATOR (SOI) DEVICE HAVING MULTIPLE DOPING PROFILE SLOPES IN THE DRIFT REGION

(75) Inventors: Mark Simpson, Ossining; Theodore Letavic, Putnam Valley, both of NY (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/200,110

(22) Filed: Nov. 25, 1998

(51) Int. Cl.$^7$ .................................................. H01L 27/01
(52) U.S. Cl. ......................... 257/347; 257/343; 257/655
(58) Field of Search .................................... 257/347, 343, 257/655

(56) References Cited

U.S. PATENT DOCUMENTS

| | | | |
|---|---|---|---|
| 5,246,870 | 9/1993 | Merchant | 437/21 |
| 5,300,448 | 4/1994 | Merchant et al. | 437/41 |
| 5,378,912 | 1/1995 | Pein | 257/335 |
| 5,412,241 | 5/1995 | Merchant | 257/409 |
| 5,438,220 | 8/1995 | Nakagawa et al. | 257/487 |
| 5,578,506 | 11/1996 | Lin | 437/21 |
| 5,648,671 | 7/1997 | Merchant | 257/347 |
| 5,710,451 | 1/1998 | Merchant | 257/347 |
| 5,767,547 * | 6/1998 | Merchant et al. | 257/408 |
| 5,780,900 | 7/1998 | Suzuki et al. | 257/335 |

* cited by examiner

Primary Examiner—Mark V. Prenty
(74) Attorney, Agent, or Firm—Steven R. Biren

(57) ABSTRACT

A lateral thin-film Silicon-On-Insulator (SOI) device includes a semiconductor substrate, a buried insulating layer on the substrate and a lateral MOS device on the buried insulating layer and having a source region of a first conductivity type formed in a body region of a second conductivity type opposite to that of the first. A lateral drift region of a first conductivity type is provided adjacent the body region, and a drain region of the first conductivity type is provided laterally spaced apart from the body region by the drift region. A gate electrode is provided over a part of the body region in which a channel region is formed during operation and over at least a part of the lateral drift region adjacent the body region, with the gate electrode being insulated from the body region and drift region by an insulation region. In order to provide an optimum combination of low "on" resistance and high breakdown voltage, the lateral drift region is provided with a graded lateral doping profile, with two substantially linearly graded drift region portions having different doping profile slopes. Specifically, the slope of the doping profile is higher in the portion of the lateral drift region adjacent the drain region than in the portion of the lateral drift region adjacent the body region.

8 Claims, 1 Drawing Sheet

LATERAL THIN-FILM SILICON-ON-INSULATOR (SOI) DEVICE HAVING MULTIPLE DOPING PROFILE SLOPES IN THE DRIFT REGION

BACKGROUND OF THE INVENTION

The invention is in the field of Semiconductor-On-Insulator (SOI) devices, and relates more particularly to lateral SOI devices suitable for high-voltage applications.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One particularly advantageous form of lateral thin-film SOI device includes a semiconductor substrate, a buried insulating layer on the substrate, and a lateral MOS device on the buried insulating layer, the MOS device, such as a MOSFET, including a semiconductor surface layer on the buried insulating layer and having a source region of a first conductivity type formed in a body region of a second conductivity type opposite to that of the first, an insulated gate electrode over a channel region of the body region and insulated therefrom by an insulation region, a lateral drift region of the first conductivity type, and a drain region of the first conductivity type laterally spaced apart from the channel region by the drift region.

A device of this type is shown in FIG. 1 common to related U.S. Pat. Nos. 5,246,870 (directed to a method) and 5,412,241 (directed to a device), commonly-assigned with the instant application and incorporated herein by reference. The device shown in FIG. 1 of the aforementioned patents is a lateral SO MOSFET device having various features, such as a thinned SOI layer with a linear lateral doping profile in the drift region and an overlying field plate, to enhance operation. As is conventional, this device is an n-channel or NMOS transistor, with n-type source and drain regions, manufactured using a process conventionally referred to as NMOS technology.

More advanced techniques for enhancing high-voltage and high-current performance parameters of SO power devices are shown in U.S. patent application Ser. No. 08/998,048, filed Dec. 24, 1997, commonly-assigned with the instant application and incorporated herein by reference. Yet another technique for improving the performance of an SOI device is to form a hybrid device, which combines more than one type of device configuration into a single structure. Thus, for example, in U.S. patent application Ser. No. 09/122,407, filed Jul. 24, 1998, commonly-assigned with the instant application and incorporated herein by reference, an SOI device is disclosed which includes a lateral DMOS transistor and an LIGB transistor in the same structure.

Thus, it will be apparent that numerous techniques and approaches have been used in order to enhance the performance of power semiconductor devices, in an ongoing effort to attain a more nearly optimum combination of such parameters as breakdown voltage, size, current-carrying capability and manufacturing ease. While all of the foregoing structures provide varying levels of improvement in device performance, no one device or structure fully optimizes all of the design requirements for high-voltage, high-current operation.

Accordingly, it would be desirable to have a transistor device structure capable of high performance in a high-voltage, high-current environment, in which operating parameters, and in particular "on" resistance and breakdown voltage, are further optimized.

SUMMARY OF THE INVENTION

It is therefore an object of the present invention to provide a transistor device structure capable of high-performance in a high-voltage, high-current environment. It is a further object of the invention to provide such a transistor device structure in which operating parameters such as "on" resistance and breakdown voltage are enhanced.

In accordance with the invention, these objects are achieved in a lateral thin-film SOI device structure of the type described above in which the lateral drift region has a graded lateral doping profile, with a first portion of the lateral drift region adjacent the body region having a first substantially linearly graded lateral doping profile having a first doping profile slope, and a second portion of the lateral drift region adjacent the drain region having a second substantially linearly graded lateral doping profile having a second doping profile slope which is greater than that of the first doping profile slope.

In a preferred embodiment of the invention, the insulation region has a discontinuity in thickness at a point above the drift region and adjacent the body region, and a transition from the first doping profile slope to the second doping profile slope in the lateral drift region occurs in a region of the drift region approximately beneath the discontinuity in the insulation region.

In a further preferred embodiment of the invention, the second doping profile slope is in the range of about 1.3 to 1.4 times greater than the first doping profile slope.

Lateral thin-film SOI devices in accordance with the present invention offer a significant improvement in that a combination of favorable performance characteristics making the devices suitable for operation in a high-voltage, high-current environment, such as low "on" resistance and high breakdown voltage, can be achieved.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
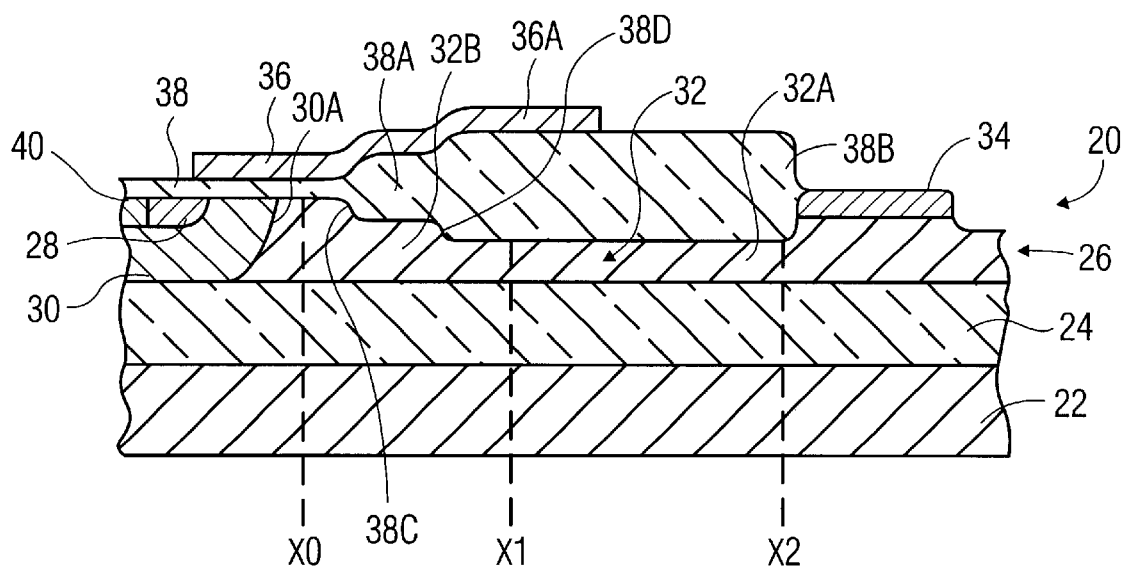
FIG. 1 shows a simplified cross-sectional view of a lateral thin-film SOI device in accordance with a preferred embodiment of the invention.

In the drawing, semiconductor regions having the same conductivity type are generally shown hatched in the same direction in the cross-sectional views, and it should be understood that the figures are not drawn to scale.

DESCRIPTION OF THE PREFERRED EMBODIMENTS

In the simplified cross-sectional view of FIG. 1, a lateral thin-film SOI MOS transistor 20 includes a semiconductor substrate 22, a buried insulating layer 24, and a semiconductor surface layer 26 in which the device is fabricated. The MOS transistor includes a source region 28 of one conductivity type, a body region 30 of a second, opposite conductivity type, a lateral drift region 32 of the first conductivity type and a drain region 34, also of the first conductivity type. The basic device structure is completed by a gate electrode 36, insulated from the underlying semiconductor surface layer 26 by an oxide insulation region 38. Within the scope of the invention, the MOS transistor used in the present invention may have various performance-enhancing features, such as a stepped oxide region 38A, 38B, an extended gate electrode structure forming a field plate portion 36A, and a thinned lateral drift region portion 32A, all as detailed in the aforementioned prior art, or other performance-enhancing features as desired, without departing from the spirit or scope of the invention. Additionally, the MOS transistor 20 may also include a surface contact region 40, in contact with source region 28, located in the body region 30 and of the same conductivity type as the body region but more highly doped.

It will be understood that while the simplified, representative device shown in the Figure depicts a particular device structure, wide variations in both device geometry and configuration can be used within the scope of the invention.

As noted above, it has been recognized in the prior art that improved device performance, in particular with reference to the tradeoff between such parameters as breakdown voltage, "on" resistance and saturated current flow, may be obtained by providing the drift region as a thinned SOI layer with a linear lateral doping profile in the drift region. However, the use of such a linear lateral doping profile (with a single slope) still results in certain compromises in device performance. Thus, for example, to achieve minimum "on" resistance and maximum saturated current flow, it is desirable to provide the highest possible lateral doping profile slope in order to maximize the amount of charge in the drift region. However, too high a slope, particularly in the relatively lightly doped area 32B of the drift region in the vicinity of the body region and where the insulation region changes thickness results in an increased charge level in this vicinity, which can lead to breakdown in the vicinity of a discontinuity in the thickness of the insulation region, due to the relatively higher electric field in this region due to the discontinuity.

Figure 2:
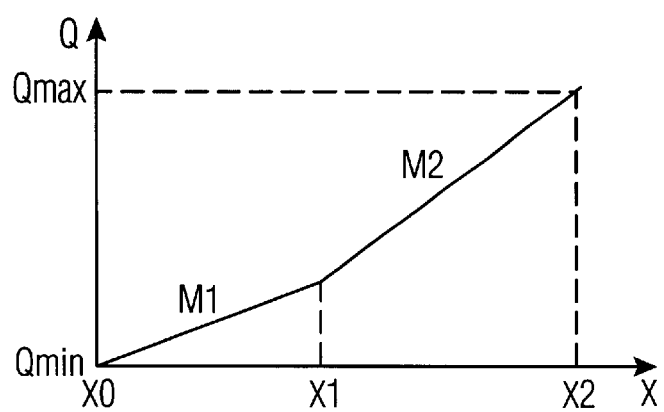
FIG. 2 shows a simplified graphical illustration of the doping profile in the lateral drift region of the device shown in FIG. 1.

The present invention is based upon the recognition that the adverse effects of the aforementioned tradeoff can be substantially reduced by providing multiple linear charge slope regions within the drift region. Thus, as illustrated in the simplified graph of FIG. 2, which plots dopant charge Q in the drift region 32 as a function of distance, a multiple linear charge slope doping profile is provided having at least a first slope M1 in the drift region area 32B in the vicinity of the body region 30 and beneath any discontinuities such as 38C, 38D in the insulation layer 38. A second portion of the lateral drift region 32A is provided with a second doping profile slope M2 which is greater than that of the first doping profile slope M1 and extends over substantially that portion of the drift region 32A which extends beneath the portion of the insulation region 38B of constant thickness and at the drain region 34 side of the device. In this manner, the device of FIG. 1 is provided with a multiple linear charge slope doping profile in the drift region, resulting in improved device performance in the areas of "on" resistance breakdown voltage and saturated current flow.

While it should be understood that the invention may be applied to various different device configurations other than the one shown in FIG. 1, such as a device with only a single step in the insulation layer, as shown for example in U.S. Pat. No. 5,246,870, or in a device with multiple field plates, as in aforementioned U.S. patent application Ser. No. 08/998,048 (in which case the change in doping profile slope may occur at a discontinuity between the field plate), as well as in a device with multiple steps in the insulation layer as shown in FIG. 1 herein, the device structure of FIG. 1 will be used by way of nonlimitative example in the following description.

Using a point $x_0$ (located half-way between the edge of body region 30 and the first insulation layer thickness transition 38C between 38 and 38A) the device of FIG. 1 maybe provided with a first doping profile slope M1 from $x_0$ to a distance x1 approximately beneath the last discontinuity (here 38D) in insulation region thickness between 38A and 38B. In a preferred embodiment of the invention, the transition between the first and second doping profile slope occurs approximately beneath that side of the insulation region thickness discontinuity 38D which is closer to the drain region. In a typical preferred example, the transition in doping profile slope may occur at a distance x1 which is closer to the drain region by an amount which is approximately equal to the thickness of the insulation region 38B, so that the discontinuity in slope is somewhat spaced from the discontinuity in insulation region thickness.

In a preferred embodiment, the second doping profile slope M2 may advantageously be in the range of about 1.3 to 1.4 times greater than the first doping profile slope M1. By way of nonlimitative example, this ratio can be achieved by a first doping profile slope of about $2.0 \times 10^{15}$ at.cm$^{-2}$/cm and second doping profile slope of about $2.6 \times 10^{15}$ at.cm$^{-2}$/cm, in a device which may have a minimum charge doping Qmin ranging from zero to a relatively low value such as $1 \times 10^{12}$ at.cm$^2$ at x0, and extending to the left from x0 in FIG. 1 at this value to the edge 30A of the body region 30. Again by way of nonlimitative example, in the device of FIG. 1 the point X0 may be located about 2–4 microns from the edge 30A of the body region 30, the point x1 may be located about 10 microns from x0, and x2 may be located about 50 microns from x1, with the understanding that these are merely illustrative examples. Alternatively, a value, such as an illustrative value of $2 \times 10^{13}$ at.cm$^2$, may be selected for the maximum charge doping Qmax at point x2, and the slopes M2 and M1 may be appropriately selected to achieve the desired minimum charge doping Qmin at x0. In a further preferred embodiment of the invention, the first doping profile slope M1 can be quite small, or even zero.

Finally, it will be recognized that the multiple linear charge slope regions in accordance with the present invention may be fabricated using readily-apparent variations in known prior-art techniques for providing a constant-slope varying doping level in the drift region of SOI devices.

In this manner, the present invention provides a transistor device structure capable of high-performance in a high-voltage, high-current environment, while enhancing the operating parameters of "on" resistance and breakdown voltage.

While the invention has been particularly shown and described with reference to several preferred embodiments thereof, it will be understood by those skilled in the art that various changes in form and detail may be made without departing from the spirit or scope of the invention, such as providing more than two different doping profile slopes within the lateral drift region.

What is claimed is:

1. A lateral thin-film Silicon-On-Insulator (SOI) device comprising a semiconductor substrate, a buried insulating layer on said substrate, and a lateral MOS device on said buried insulating layer and having a source region of a first conductivity type formed in a body region of a second conductivity type opposite to that of the first, a lateral drift region of said first conductivity type adjacent said body region, a drain region of said first conductivity type and laterally spaced apart from said body region by said lateral drift region, and a gate electrode over a part of said body region in which a channel region is formed during operation and over at least a part of said lateral drift region adjacent said body region, said gate electrode being insulated from said body region and drift region by an insulation region, said lateral drift region having a graded lateral doping profile, a first portion of said lateral drift region adjacent said body region having a first substantially linearly graded lateral doping profile having a first doping profile slope, and a second portion of said lateral drift region adjacent said drain region having a second substantially linearly graded lateral doping profile having a second doping profile slope which is greater than that of said first doping profile slope, wherein said insulation region has a discontinuity in thickness at a point above said drift region and adjacent said body region, and a transition from said first doping profile slope to said second doping profile slope in said lateral drift region occurs in a region of said drift region approximately beneath said discontinuity.

2. A lateral thin-film Silicon-On-Insulator (SOI) device as in claim 1, wherein said insulating region has a plurality of said discontinuities in thickness above said drift region, and said transition occurs in a region of said drift region approximately beneath that one of said discontinuities which is located furthest from said body region.

3. A lateral thin-film Silicon-On-Insulator (SOI) device as in claim 1, wherein said second doping profile slope is in the range of about 1.3 to 1.4 times greater than said first doping profile slope.

4. A lateral thin-film Silicon-On-Insulator (SOI) device as in claim 2, wherein said second doping profile slope is in the range of about 1.3 to 1.4 times greater than said first doping profile slope.

5. A lateral thin-film Silicon-On-Insulator (SOI) device as in claim 1, wherein said first doping profile slope is about $2.0 \times 10^{15}$ at.cm$^{-2}$/cm and said second doping profile slope is about $2.6 \times 10^{15}$ at.cm$^{-2}$/cm.

6. A lateral thin-film Silicon-On-Insulator (SOI) device as in claim 2, wherein said first doping profile slope is about $2.0 \times 10^{15}$ at.cm$^{-2}$/cm and said second doping profile slope is about $2.6 \times 10^{15}$ at.cm$^{-2}$/cm.

7. A lateral thin-film Silicon-On-Insulator (SOI) device as in claim 1, wherein said transition in doping profile slope occurs in a portion of said region of the drift region which is located beneath that side of said discontinuity which is closer to said drain region.

8. A lateral thin-film Silicon-On-Insulator (SOI) device as in claim 2, wherein said transition in doping profile slope occurs in a portion of said region of the drift region which is located beneath that side of said furthest discontinuity which is closer to said drain region.

* * * * *